(12) United States Patent
Yamazaki et al.

(10) Patent No.: US 9,244,136 B2
(45) Date of Patent: Jan. 26, 2016

(54) MAGNETIC SENSOR WITH REDUCED EFFECT OF INTERLAYER COUPLING MAGNETIC FIELD

(71) Applicant: TDK CORPORATION, Tokyo (JP)

(72) Inventors: Hiroshi Yamazaki, Tokyo (JP); Yoshiyuki Mizoguchi, Tokyo (JP); Takahiro Imai, Tokyo (JP); Satoshi Abe, Tokyo (JP); Homare Tokida, Tokyo (JP)

(73) Assignee: TDK CORPORATION, Tokyo (JP)

( * ) Notice: Subject to any disclaimer, the term of this patent is extended or adjusted under 35 U.S.C. 154(b) by 97 days.

(21) Appl. No.: 14/177,602

(22) Filed: Feb. 11, 2014

(65) Prior Publication Data
US 2014/0292321 A1 Oct. 2, 2014

(30) Foreign Application Priority Data

Mar. 29, 2013 (JP) .................................. 2013-073685

(51) Int. Cl.
*G01R 33/09* (2006.01)
(52) U.S. Cl.
CPC ............ *G01R 33/093* (2013.01); *G01R 33/098* (2013.01)
(58) Field of Classification Search
CPC ..... G01R 33/09; G01R 33/093; G01R 33/098

USPC .................................................. 324/228, 252
See application file for complete search history.

(56) References Cited

U.S. PATENT DOCUMENTS 5,909,115 A  6/1999 Kano et al.
7,615,996 B1 * 11/2009 Machita et al. ............... 324/252
2003/0137381 A1  7/2003 Toyoda et al.

FOREIGN PATENT DOCUMENTS

JP  A-2008-151759  7/2008
WO  WO 2008/072610 A1  6/2008

* cited by examiner

*Primary Examiner* — Reena Aurora
(74) *Attorney, Agent, or Firm* — Oliff PLC (57) ABSTRACT

A magnetic sensor includes an MR element and a pair of magnets. The MR element includes a magnetization pinned layer having a magnetization pinned in a direction parallel to an X direction, a free layer having a magnetization that varies depending on an X-direction component of an external magnetic field, and a nonmagnetic layer interposed between the magnetization pinned layer and the free layer. The magnetization pinned layer, the nonmagnetic layer and the free layer are stacked to be adjacent in a Y direction. The free layer receives an interlayer coupling magnetic field in a direction parallel to the X direction resulting from the magnetization pinned layer. The pair of magnets applies a bias magnetic field to the free layer. The bias magnetic field includes a first component in a direction opposite to that of the interlayer coupling magnetic field and a second component in a Z direction.

4 Claims, 5 Drawing Sheets

MAGNETIC SENSOR WITH REDUCED EFFECT OF INTERLAYER COUPLING MAGNETIC FIELD

BACKGROUND OF THE INVENTION

1. Field of the Invention

The present invention relates to a magnetic sensor including a magnetoresistive element, and to a magnetic sensor system including the magnetic sensor and a scale.

2. Description of the Related Art

In recent years, magnetic sensor systems have been employed to detect a physical quantity associated with the rotational movement or linear movement of a moving object in a variety of applications. Typically, a magnetic sensor system includes a scale and a magnetic sensor, and the magnetic sensor is configured to generate a signal associated with the relative positional relationship between the scale and the magnetic sensor.

Such a magnetic sensor system is disclosed in JP 2008-151759A, WO 2008/072610 A1, US 2003/0137381 A1 and U.S. Pat. No. 5,909,115, for example.

The scale of the magnetic sensor system for use with a rotationally moving object is, in general, a rotating body that moves in response to the movement of the moving object. The rotating body can be, for example, a multipole-magnetized magnet having a plurality of pairs of N and S poles alternately arranged in a circumferential direction, or a gear having teeth formed of a magnetic material. In this case, the magnetic sensor system detects, for example, the rotational position and/or the rotational speed of the rotating body as the physical quantity.

The scale of the magnetic sensor system for use with a linearly moving object is, for example, a linear scale having a plurality of pairs of N and S poles alternately arranged in a linear configuration. In such a case, one of the linear scale and the magnetic sensor moves in response to the movement of the moving object, and the magnetic sensor system detects the relative position and/or speed of the linear scale with respect to the magnetic sensor as the physical quantity.

The magnetic sensor includes a magneto-sensitive element. JP 2008-151759A, WO 2008/072610 A1, and US 2003/0137381 A1 each disclose a magnetic sensor that employs a spin-valve magnetoresistive (MR) element as the magneto-sensitive element. The spin-valve MR element includes a magnetization pinned layer having a fixed magnetization, a free layer having a magnetization whose direction and magnitude vary depending on an external magnetic field, and a nonmagnetic layer interposed between the magnetization pinned layer and the free layer. Examples of spin-valve MR elements include a TMR element in which the nonmagnetic layer is a tunnel barrier layer and a GMR element in which the nonmagnetic layer is a nonmagnetic conductive layer.

In the magnetic sensor employing a spin-valve MR element, the free layer may sometimes receive an interlayer coupling magnetic field resulting from the magnetization pinned layer, as described in JP 2008-151759A. The interlayer coupling magnetic field is in a direction the same as or opposite to the magnetization direction of the magnetization pinned layer. If the free layer receives the interlayer coupling magnetic field, there arises the problem that the amount of a change in the resistance of the MR element with respect to a change in the magnitude of the external magnetic field varies depending on the direction of the external magnetic field, and the problem of a reduced amount of a change in the resistance of the MR element with respect to a change in the magnitude of the external magnetic field.

JP 2008-151759A describes that reducing the interlayer coupling magnetic field to zero makes the output waveform of the magnetic sensor unstable. JP 2008-151759A further teaches a technique for stabilizing the output waveform of the magnetic sensor by applying a bias magnetic field to the free layer in a direction orthogonal to the magnetization direction of the magnetization pinned layer through the use of a permanent magnet.

However, when the interlayer coupling magnetic field is not zero, this technique cannot solve the aforementioned problem associated with the interlayer coupling magnetic field.

WO 2008/072610 A1 teaches providing a soft magnetic material element on a side of the MR element so as to apparently improve the magnetic detection sensitivity of the magnetic sensor even in the presence of an interlayer coupling magnetic field being received by the free layer. However, this technique does not directly reduce the effect of the interlayer coupling magnetic field.

US 2003/0137381 A1 and U.S. Pat. No. 5,909,115 each describe a technique for applying a bias magnetic field to the MR element. However, these documents give no consideration to the effect of the interlayer coupling magnetic field.

OBJECT AND SUMMARY OF THE INVENTION

It is an object of the present invention to provide a magnetic sensor and a magnetic sensor system that use a spin-valve magnetoresistive element and are capable of reducing the effect of an interlayer coupling magnetic field that the free layer receives.

A magnetic sensor of the present invention is configured to detect a component in a first direction of an external magnetic field. The magnetic sensor includes a magnetoresistive element and a bias field generation unit. The magnetoresistive element includes a magnetization pinned layer having a magnetization pinned in a direction parallel to the first direction, a free layer having a magnetization that varies depending on the component in the first direction of the external magnetic field, and a nonmagnetic layer interposed between the magnetization pinned layer and the free layer. The magnetization pinned layer, the nonmagnetic layer and the free layer are stacked to be adjacent in a second direction orthogonal to the first direction. The free layer receives an interlayer coupling magnetic field in the direction parallel to the first direction resulting from the magnetization pinned layer. The bias field generation unit includes at least one magnet and applies a bias magnetic field to the free layer. The magnetoresistive element and the at least one magnet are aligned in a third direction orthogonal to the first and second directions. The at least one magnet has an end face facing the magnetoresistive element. The at least one magnet has a magnetization in a direction inclined with respect to a direction perpendicular to the end face. The magnetization of the at least one magnet includes a first magnetization component parallel to the first direction and a second magnetization component parallel to the third direction. The bias magnetic field includes a first magnetic field component in a direction opposite to the direction of the interlayer coupling magnetic field and a second magnetic field component parallel to the third direction. The direction of the first magnetic field component is opposite to that of the first magnetization component. The second magnetic field component is in the same direction as the second magnetization component.

In the magnetic sensor of the present invention, the at least one magnet may be a pair of magnets arranged with the magnetoresistive element in between. The end face of the at least one magnet may be perpendicular to the third direction.

A magnetic sensor system of the present invention includes the magnetic sensor of the present invention and a scale whose relative position with respect to the magnetic sensor is variable in the first direction. The magnetic sensor system is configured so that a change in the relative position of the scale with respect to the magnetic sensor causes a change in the component in the first direction of the external magnetic field.

In the magnetic sensor and the magnetic sensor system of the present invention, the bias magnetic field applied to the free layer by the bias field generation unit includes the first magnetic field component in the direction opposite to the direction of the interlayer coupling magnetic field and the second magnetic field component in the third direction orthogonal to the first and second directions. The first magnetic field component acts to cancel out the interlayer coupling magnetic field. The second magnetic field component acts to stabilize the magnetization direction of the free layer when the external magnetic field has a zero component in the first direction. Consequently, the present invention makes it possible to reduce the effect of the interlayer coupling magnetic field that the free layer receives in the magnetic sensor and the magnetic sensor system employing the spin-valve magnetoresistive element.

Other and further objects, features and advantages of the present invention will appear more fully from the following description.

DETAILED DESCRIPTION OF THE PREFERRED EMBODIMENT

Figure 1:
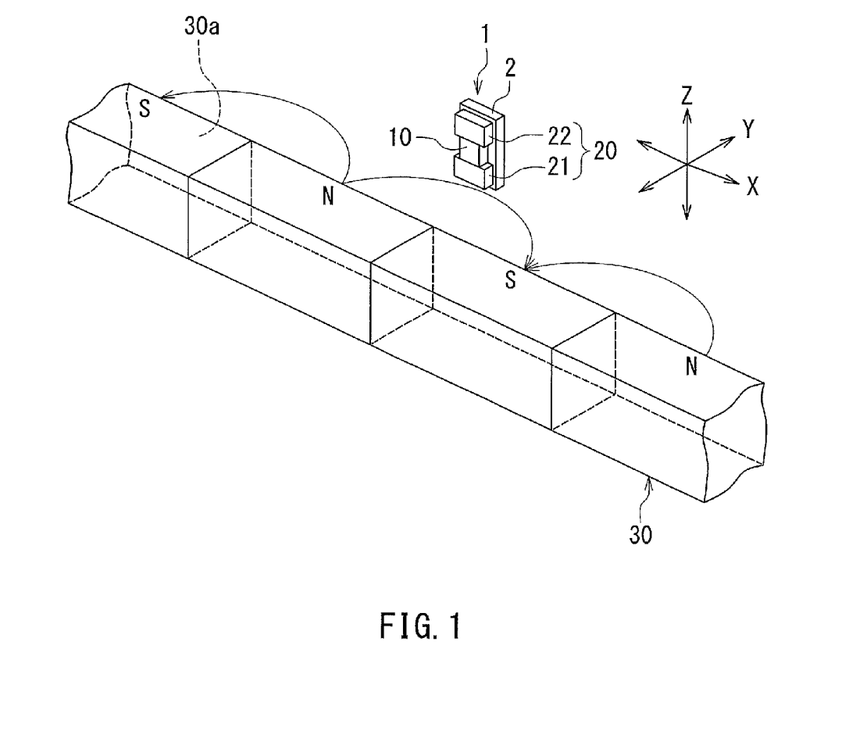
FIG. 1 is a perspective view illustrating the general configuration of a magnetic sensor system according to an embodiment of the invention.

A preferred embodiment of the present invention will now be described in detail with reference to the drawings. First, reference is made to FIG. 1 to describe the general configuration of a magnetic sensor system according to the embodiment of the invention. FIG. 1 is a perspective view illustrating the general configuration of the magnetic sensor system according to this embodiment. As shown in FIG. 1, the magnetic sensor system according to this embodiment includes a magnetic sensor 1 according to the embodiment and a scale 30 whose relative position with respect to the magnetic sensor 1 is variable in a first direction. The first direction will hereinafter be referred to as the X direction. In this embodiment, the scale 30 is particularly a linear scale having a plurality of pairs of N and S poles alternately arranged in a linear configuration along the X direction. The scale 30 has a side surface 30a parallel to the X direction. The magnetic sensor 1 is disposed to face the side surface 30a. One of the magnetic sensor 1 and the scale 30 moves in the X direction in response to the movement of a moving object (not illustrated). This causes a change in the relative position of the scale 30 with respect to the magnetic sensor 1 in the X direction. In FIG. 1 the curved arrows indicate a magnetic flux produced by the scale 30. The magnetic sensor 1 is configured to detect a component in the X direction of an external magnetic field. Hereinafter, "component in the X direction" will be expressed as "X-direction component", and the X-direction component of the external magnetic field will be denoted by symbol Hx. The external magnetic field is produced by the scale 30. A change in the relative position of the scale 30 with respect to the magnetic sensor 1 causes a change in the X-direction component Hx of the external magnetic field.

Figure 2:
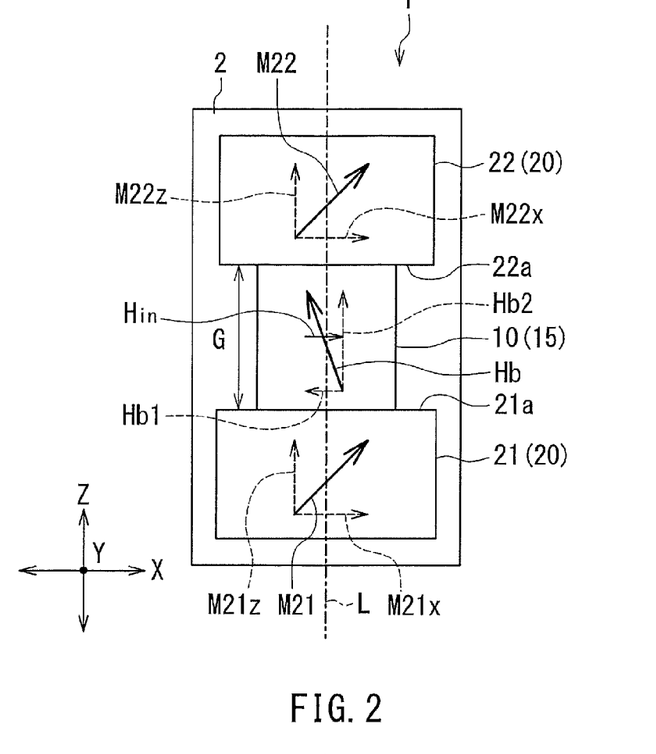
FIG. 2 is a plan view of a magnetic sensor according to the embodiment of the invention.

The magnetic sensor 1 will now be described with reference to FIG. 1 and FIG. 2. FIG. 2 is a plan view of the magnetic sensor 1. The magnetic sensor 1 includes a substrate 2, a spin-valve magnetoresistive (MR) element 10 disposed on the substrate 2, and a bias field generation unit 20. The MR element 10 may be a TMR element or a GMR element. The bias field generation unit 20 includes at least one magnet. The at least one magnet may be spaced from the MR element 10 or in contact with the MR element 10. In this embodiment, the at least one magnet is particularly a pair of magnets 21 and 22 arranged with the MR element 10 in between. The magnets 21 and 22 are placed on the substrate 2 and are both in contact with the MR element 10. Each of the magnets 21 and 22 has a rectangular solid shape, for example. FIG. 1 and FIG. 2 show an example in which the MR element 10 has a rectangular solid shape. However, the MR element 10 may have any other shape, such as a cylindrical shape.

Figure 3:
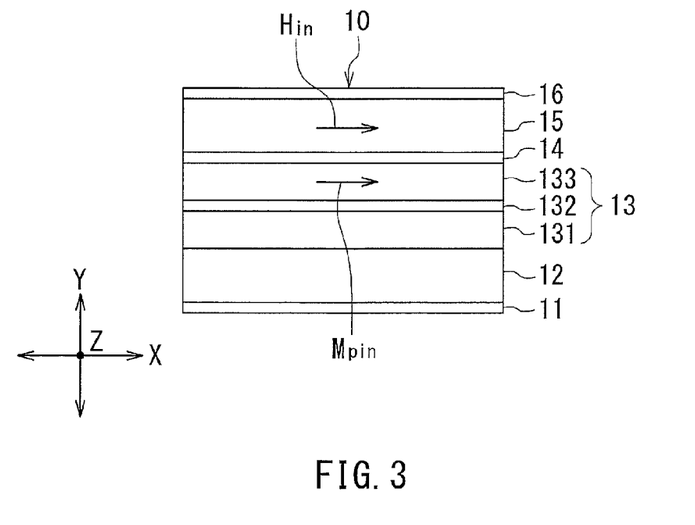
FIG. 3 is a side view illustrating an example of the configuration of the MR element shown in FIG. 2.

The MR element 10 will now be described with reference to FIG. 3. FIG. 3 is a side view illustrating an example of the configuration of the MR element 10. The MR element 10 includes at least a magnetization pinned layer 13 having a magnetization pinned in a direction parallel to the X direction, a free layer 15 having a magnetization that varies depending on the X-direction component Hx of the external magnetic field, and a nonmagnetic layer 14 interposed between the magnetization pinned layer 13 and the free layer 15.

In the example shown in FIG. 3, the MR element 10 further includes an underlayer 11, an antiferromagnetic layer 12 and a protective layer 16. In this example, the underlayer 11, the antiferromagnetic layer 12, the magnetization pinned layer 13, the nonmagnetic layer 14, the free layer 15, and the protective layer 16 are stacked in this order on the substrate 2. The underlayer 11 and the protective layer 16 are conductive. The underlayer 11 is provided for eliminating the effects of the crystal axis of the substrate 2 and to improve the crystallinity and orientability of each layer formed on the underlayer 11. The underlayer 11 may be formed of Ta or Ru, for example. The antiferromagnetic layer 12 is to pin the magnetization direction of the magnetization pinned layer 13 by means of exchange coupling with the magnetization pinned layer 13. The antiferromagnetic layer 12 is formed of an antiferromagnetic material such as IrMn or PtMn.

The magnetization direction of the magnetization pinned layer 13 is pinned by exchange coupling between the antiferromagnetic layer 12 and the magnetization pinned layer 13 at the interface therebetween. In the example shown in FIG. 3, the magnetization pinned layer 13 includes an outer layer 131, a nonmagnetic intermediate layer 132 and an inner layer 133 stacked in this order on the antiferromagnetic layer 12, and is thus formed as a so-called synthetic pinned layer. The outer layer 131 and the inner layer 133 are each formed of a soft magnetic material such as CoFe, CoFeB or CoNiFe. The magnetization direction of the outer layer 131 is pinned by exchange coupling between the outer layer 131 and the antiferromagnetic layer 12. The outer layer 131 and the inner layer 133 are antiferromagnetically coupled to each other, and their magnetizations are thus pinned in mutually opposite directions. The nonmagnetic intermediate layer 132 induces antiferromagnetic exchange coupling between the outer layer 131 and the inner layer 133 so as to pin the magnetizations of the outer layer 131 and the inner layer 133 in mutually opposite directions. The nonmagnetic intermediate layer 132 is formed of a nonmagnetic material such as Ru. When the magnetization pinned layer 13 includes the outer layer 131, the nonmagnetic intermediate layer 132 and the inner layer 133, the magnetization direction of the magnetization pinned layer 13 refers to that of the inner layer 133. In FIG. 3, the arrow labeled Mpin represents the magnetization of the magnetization pinned layer 13. The direction indicated by this arrow is the magnetization direction of the magnetization pinned layer 13.

If the MR element 10 is a TMR element, the nonmagnetic layer 14 is a tunnel barrier layer. The tunnel barrier layer may be formed by oxidizing a part or the whole of a magnesium layer. If the MR element 10 is a GMR element, the nonmagnetic layer 14 is a nonmagnetic conductive layer. The free layer 15 is formed of, for example, a soft magnetic material such as CoFe, CoFeB, NiFe, or CoNiFe. The protective layer 16 is provided for protecting the layers located thereunder. The protective layer 16 may be formed of Ta, Ru, W, or Ti, for example.

The magnetization pinned layer 13, the nonmagnetic layer 14 and the free layer 15 are stacked to be adjacent in a second direction orthogonal to the X direction. The second direction will hereinafter be referred to as the Y direction. In this embodiment, the Y direction is perpendicular to the side surface 30a of the scale 30.

In the MR element 10, the magnetization of the free layer 15 varies depending on the magnetic field applied to the free layer 15. More specifically, the direction and magnitude of the magnetization of the free layer 15 vary depending on the direction and magnitude of the magnetic field applied to the free layer 15. The MR element 10 varies in resistance depending on the direction and magnitude of the magnetization of the free layer 15. For example, if the free layer 15 has a magnetization of a constant magnitude, the MR element 10 has a minimum resistance when the magnetization of the free layer 15 is in the same direction as that of the magnetization pinned layer 13, and has a maximum resistance when the magnetization of the free layer 15 is in the opposite direction to that of the magnetization pinned layer 13.

If the MR element 10 is a GMR element, the MR element 10 may be of either the current-perpendicular-to-plane (CPP) type in which a current is fed in a direction intersecting the plane of the layers constituting the MR element 10, such as a direction perpendicular to the plane of the layers constituting the MR element 10, or the current-in-plane (CIP) type in which a current is fed in a direction generally parallel to the plane of the layers constituting the MR element 10. If the MR element 10 is a TMR element, it is of the CPP type.

If the MR element 10 is of the CPP type, for example, the underlayer 11 and the protective layer 16 are connected with electrodes (not illustrated) through which the MR element 10 is supplied with a current intended to allow the magnetic sensor 1 to generate a signal associated with the resistance of the MR element 10. The current flows in a direction intersecting the plane of the layers constituting the MR element 10, such as the direction perpendicular to the plane of the layers constituting the MR element 10. For example, if a current of a constant value is supplied to the MR element 10, the signal associated with the resistance of the MR element 10 can be generated by using the potential difference across the MR element 10. If the MR element 10 is of the CIP type, for example, two electrodes (not illustrated) are connected to two locations on the protective layer 16 apart from each other, so that a current for the above-mentioned purpose is supplied to the MR element 10 through these electrodes. The current flows in a direction generally parallel to the plane of the layers constituting the MR element 10. In this case also, the signal associated with the resistance of the MR element 10 can be generated in the same manner as above.

In this embodiment, magnetic interlayer coupling takes place between the free layer 15 and the magnetization pinned layer 13 via the nonmagnetic layer 14. This causes the free layer 15 to receive an interlayer coupling magnetic field Hin in a direction parallel to the X direction resulting from the magnetization pinned layer 13. The direction of the interlayer coupling magnetic field Hin is the same as or opposite to the magnetization direction of the magnetization pinned layer 13. In FIG. 3, the arrow labeled Hin represents the interlayer coupling magnetic field Hin. The direction indicated by this arrow is the direction of the interlayer coupling magnetic field Hin. FIG. 3 illustrates an example in which the interlayer coupling magnetic field Hin is in the same direction as the magnetization Mpin of the magnetization pinned layer 13.

As shown in FIG. 2, the MR element 10 and the pair of magnets 21 and 22 are aligned in a third direction orthogonal to the X and Y directions. The third direction will hereinafter be referred to as the Z direction. More specifically, when viewed in the Y direction, the centers of the MR element 10 and the magnets 21 and 22 are collinear along a straight line L extending in the Z direction, as shown in FIG. 2.

As used herein, each of the X, Y and Z directions is defined as including one particular direction and a direction opposite thereto, as indicated by the respective double-headed arrows in FIG. 1. On the other hand, the direction of any magnetic field or magnetization is defined as indicating a single particular direction.

The magnet 21 has an end face 21a facing the MR element 10. The magnet 22 has an end face 22a facing the MR element 10. The end faces 21a and 22a are perpendicular to the Z direction. In the example shown in FIG. 2, the N pole of the magnet 21 appears at the end face 21a while the S pole of the magnet 22 appears at the end face 22a. The distance between the magnets 21 and 22 or the distance between the end faces 21a and 22a is denoted by symbol G.

The magnet 21 has a magnetization in a direction inclined with respect to a direction perpendicular to the end face 21a. In FIG. 2, the arrow labeled M21 represents the magnetization of the magnet 21. The direction indicated by this arrow is the direction of the magnetization of the magnet 21. The magnetization M21 of the magnet 21 includes a first magnetization component M21x parallel to the X direction and a second magnetization component M21z parallel to the Z direction.

The magnet 22 has a magnetization in a direction inclined with respect to a direction perpendicular to the end face 22a. In FIG. 2, the arrow labeled M22 represents the magnetization of the magnet 22. The direction indicated by this arrow is the direction of the magnetization of the magnet 22. The magnetization M22 of the magnet 22 includes a first magnetization component M22x parallel to the X direction and a second magnetization component M22z parallel to the Z direction. The magnetization component M22x is in the same direction as the magnetization component M21x. The magnetization component M22z is in the same direction as the magnetization component M21z.

The magnet 21 can be formed by magnetizing a molded body of a magnetic material that is to become the magnet 21. The direction of the magnetization of the magnet 21 can be established by the direction of the magnetic field applied to the molded body when magnetizing the molded body. The magnet 22 can be formed in the same manner as the magnet 21.

The bias field generation unit 20 or a pair of magnets 21, 22 applies a bias magnetic field Hb to the free layer 15. The bias magnetic field Hb includes a first magnetic field component Hb1 in a direction opposite to the direction of the interlayer coupling magnetic field Hin and a second magnetic field component Hb2 in the Z direction. The direction of the first magnetic field component Hb1 is opposite to the direction of the magnetization components M21x and M22x. The second magnetic field component Hb2 is in the same direction as the magnetization components M21z and M22z. A detailed description will be made later as to the phenomenon that the direction of the first magnetic field component Hb1 is opposite to the direction of the magnetization components M21x and M22x.

The function and effects of the magnetic sensor 1 and the magnetic sensor system according to this embodiment will now be described. In the magnetic sensor system according to this embodiment, the scale 30 produces an external magnetic field to be detected by the magnetic sensor 1. A change in the relative position of the scale 30 with respect to the magnetic sensor 1 causes a change in the X-direction component Hx of the external magnetic field. More specifically, as the relative position of the scale 30 with respect to the magnetic sensor 1 changes, the external magnetic field changes direction such that the direction of the external magnetic field rotates about the Z-direction axis when viewed from the magnetic sensor 1. As a result, the X-direction component Hx of the external magnetic field changes. The X-direction component Hx is sometimes oriented in the same direction as the magnetization Mpin of the magnetization pinned layer 13 and sometimes oriented in the opposite direction to the magnetization Mpin. Hereinafter, the magnitude of the X-direction component Hx when the X-direction component Hx is oriented in the opposite direction to the magnetization Mpin will be expressed in positive values, and the magnitude of the X-direction component Hx when the X-direction component Hx is oriented in the same direction as the magnetization Mpin will be expressed in negative values.

The magnetic sensor 1 includes the spin-valve MR element 10. The MR element 10 varies in resistance depending on the X-direction component Hx of the external magnetic field. The magnetic sensor 1 generates a signal associated with the resistance of the MR element 10. This signal allows for detection of a physical quantity associated with the linear movement of the moving object, such as the relative position and/or speed of the scale 30 with respect to the magnetic sensor 1.

In the MR element 10, the free layer 15 receives the interlayer coupling magnetic field Hin in the direction parallel to the X direction resulting from the magnetization pinned layer 13. Here, consider a case where the bias field generation unit 20 of the embodiment is not provided. In such a case, there arises the problem that the amount of a change in the resistance of the MR element 10 with respect to a change in the magnitude of the X-direction component Hx of the external magnetic field varies depending on the direction of the X-direction component Hx, and the problem of a reduced amount of a change in the resistance of the MR element 10 with respect to a change in the magnitude of the X-direction component Hx, which results in a reduced sensitivity of the MR element 10. This will be described in detail below with reference to FIG. 4.

Figure 4:
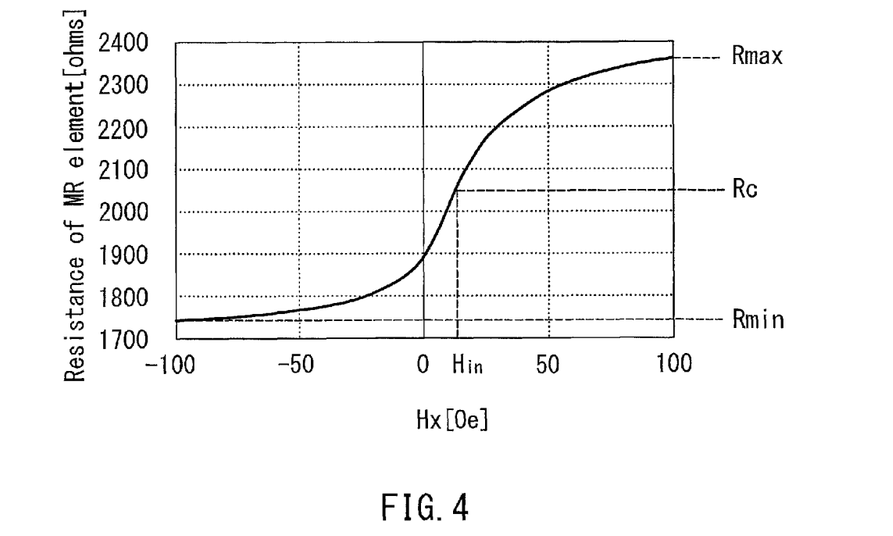
FIG. 4 is a characteristic diagram illustrating an example of the relationship between a component in an X direction of an external magnetic field and the resistance of the MR element.

FIG. 4 is a characteristic diagram illustrating an example of the relationship between the X-direction component Hx of the external magnetic field and the resistance of the MR element 10. In FIG. 4, the horizontal axis represents the X-direction component Hx of the external magnetic field, and the vertical axis represents the resistance of the MR element 10. The horizontal axis is expressed in oersteds (Oe) (1 Oe=79.6 A/m) and the vertical axis is expressed in ohms As shown in FIG. 4, the maximum resistance of the MR element 10 is represented by Rmax, the minimum resistance of the MR element 10 is represented by Rmin, and the median value between Rmax and Rmin, i.e., (Rmax+Rmin)/2, is represented by Rc. Assume here that the MR element 10 has a resistance of Rc when the X-direction component Hx is zero. In such a case, the amount of a change in the resistance of the MR element 10 with respect to a change in the magnitude of the X-direction component Hx does not vary depending on the direction of the X-direction component Hx and, when the X-direction component Hx is around zero, a large amount of a change in the resistance of the MR element 10 with respect to a change in the magnitude of the X-direction component Hx is obtained to make the MR element 10 high in sensitivity. However, if the free layer 15 receives the interlayer coupling magnetic field Hin, the value of the X-direction component Hx at which the MR element 10 has a resistance of Rc differs from zero by the magnitude of the interlayer coupling magnetic field Hin. As a result, the amount of a change in the resistance of the MR element 10 with respect to a change in the magnitude of the X-direction component Hx varies depending on the direction of the X-direction component Hx and, when the X-direction component Hx is around zero, the amount of a change in the resistance of the MR element 10 with respect to a change in the magnitude of the X-direction component Hx is reduced to cause the MR element 10 to be low in sensitivity.

In this embodiment, the direction and magnitude of the interlayer coupling magnetic field Hin being received by the free layer 15 can be determined by determining, with the bias field generation unit 20 eliminated, the relationship between the X-direction component Hx and the resistance of the MR element 10 as shown in FIG. 4 and further determining the value of the X-direction component Hx at which the MR element 10 has a resistance of Rc.

As shown in FIG. 2, the magnetic sensor 1 according to this embodiment includes the bias field generation unit 20 to apply the bias magnetic field Hb to the free layer 15. The bias magnetic field Hb includes the first magnetic field component Hb1 in the opposite direction to the interlayer coupling magnetic field Hin and the second magnetic field component Hb2 in the Z direction. The first magnetic field component Hb1 acts to cancel out the interlayer coupling magnetic field Hin.

Figure 5:
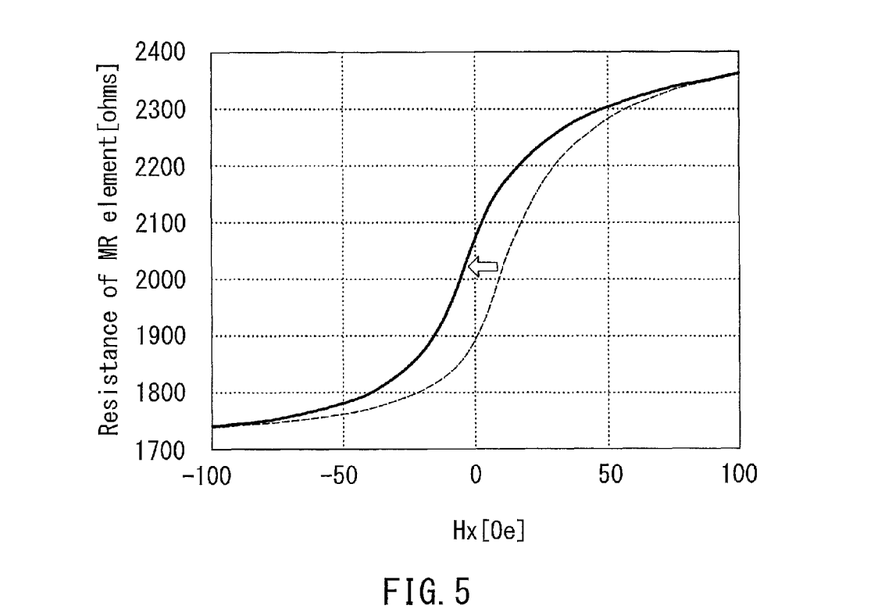
FIG. 5 is a characteristic diagram illustrating the effect of a first magnetic field component of a bias magnetic field.

Now, the results of an experiment will be shown which was conducted to examine the aforementioned action of the first magnetic field component Hb1. In the experiment, the relationship between the X-direction component Hx of the external magnetic field and the resistance of the MR element 10 was determined both in the presence and absence of the bias field generation unit 20 (the magnets 21 and 22). The MR element 10 employed for the experiment had a square shape with a side of 4 μm when viewed in the Y direction. The magnets 21 and 22 employed for the experiment each had a rectangular shape with a dimension in the Z direction of 3 μm and a dimension in the Y direction of 5 μM when viewed in the Y direction. When in the presence of the bias field generation unit 20 (the magnets 21 and 22), the magnets 21 and 22 were in contact with the MR element 10 and the distance G between the magnets 21 and 22 was 4 μm. FIG. 5 shows the results of the experiment. The horizontal axis and the vertical axis of FIG. 5 are the same as those of FIG. 4. In FIG. 5, the broken line indicates the relationship between the X-direction component Hx and the resistance of the MR element 10 in the absence of the bias field generation unit 20, while the solid line indicates the relationship between the X-direction component Hx and the resistance of the MR element 10 in the presence of the bias field generation unit 20. As shown in FIG. 5, when in the presence of the bias field generation unit 20, the amount of a change in the resistance of the MR element 10 with respect to a change in the magnitude of the X-direction component Hx is almost the same between the positive-value region for the X-direction component Hx and the negative-value region for the X-direction component Hx. Further, when the X-direction component Hx is around zero, a larger amount of a change in the resistance of the MR element 10 with respect to a change in the magnitude of the X-direction component Hx and thus a higher sensitivity of the MR element 10 are achieved in the presence of the bias field generation unit 20 than in the absence of the bias field generation unit 20.

The second magnetic field component Hb2 of the bias magnetic field Hb acts to stabilize the magnetization direction of the free layer 15 when the X-direction component Hx of the external magnetic field is zero. It is thereby possible to prevent the output signal waveform of the magnetic sensor 1 from becoming unstable due to the cancellation of the interlayer coupling magnetic field Hin by the first magnetic field component Hb1.

Consequently, this embodiment makes it possible to reduce the effect of the interlayer coupling magnetic field Hin that the free layer 15 receives in the magnetic sensor 1 and the magnetic sensor system employing the spin-valve MR element 10.

Figure 6:
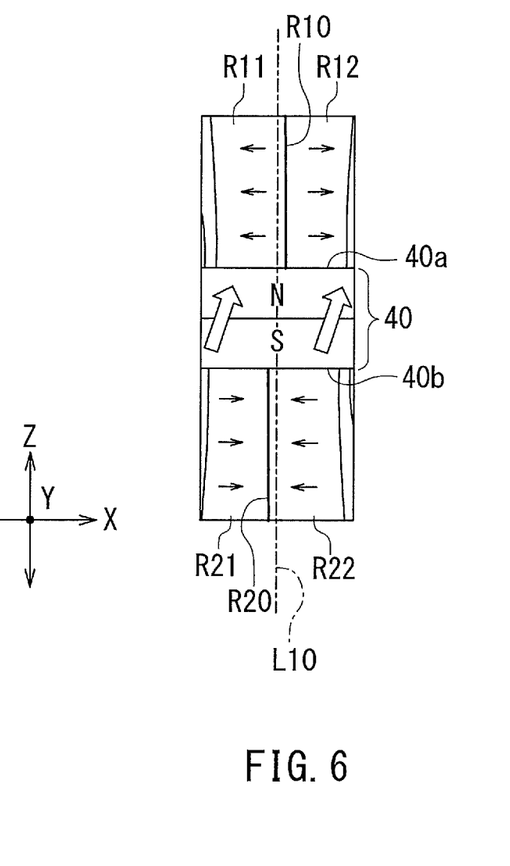
FIG. 6 is an explanatory diagram illustrating the relationship between the magnetization direction of a magnet and a component in the X direction of a magnetic field produced by the magnet.
Figure 7:
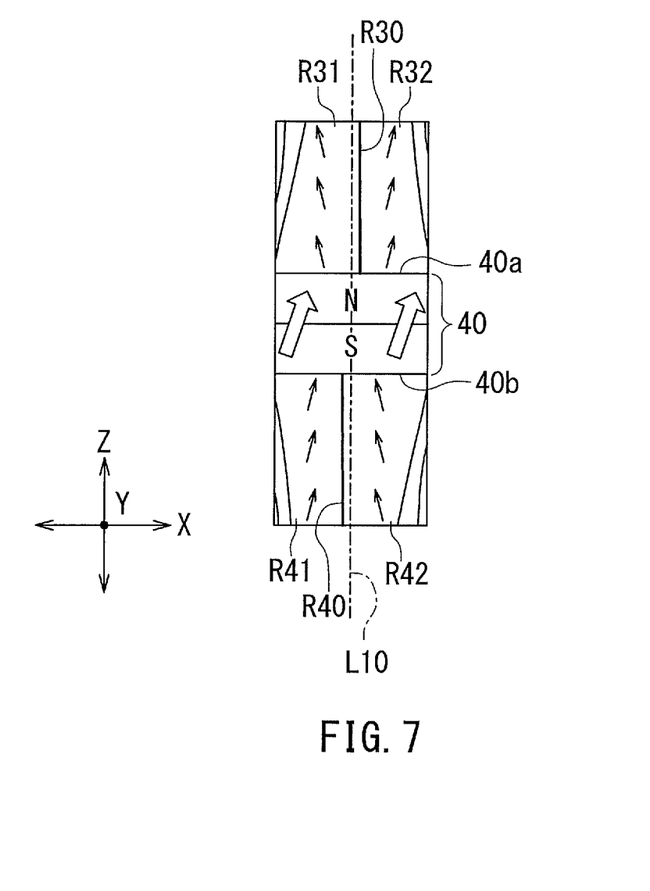
FIG. 7 is an explanatory diagram illustrating the relationship between the magnetization direction of the magnet and the direction of the magnetic field produced by the magnet.

Now, a detailed description will be given as to the phenomenon that the direction of the magnetic field component Hb1 is opposite to the direction of the magnetization components M21x and M22x as shown in FIG. 2. To begin with, reference is made to FIG. 6 and FIG. 7 to describe the results of a simulation that was performed to examine a magnetic field generated by a magnet having a magnetization in a direction inclined with respect to a direction perpendicular to the end faces of the magnet. The simulation used a magnet 40 as shown in FIG. 6 and FIG. 7. The magnet 40 has end faces 40a and 40b opposite to each other in the Z direction. The end faces 40a and 40b are perpendicular to the Z direction. The magnet 40 has a magnetization in a direction inclined with respect to the direction perpendicular to the end faces 40a and 40b, that is, with respect to the Z direction. The N pole of the magnet 40 appears at the end face 40a while the S pole of the magnet 40 appears at the end face 40b. The magnet 40 corresponds to the magnet 21 or 22 shown in FIG. 2. Where the magnet 40 corresponds to the magnet 21, the end face 40a corresponds to the end face 21a. Where the magnet 40 corresponds to the magnet 22, the end face 40b corresponds to the end face 22a.

The simulation examined the strength of an X-direction component of the magnetic field and the direction of the magnetic field in a space in the vicinity of each of the end faces 40a and 40b. In the simulation, the strength of the X-direction component of the magnetic field was expressed in positive values when the X-direction component was oriented rightward in FIG. 6 and FIG. 7, and in negative values when the X-direction component was oriented leftward in FIG. 6 and FIG. 7. Further, in the simulation, the direction from bottom to top on the X-Z plane shown in FIG. 6 and FIG. 7 was defined as the reference direction, so that the directions of the magnetization and the magnetic field were expressed in an angle with respect to the reference direction. The angle in a clockwise direction from the reference direction was expressed in positive values, and the angle in a counterclockwise direction from the reference direction was expressed in negative values. The direction of the magnetization of the magnet 40 is at 45°.

FIG. 6 shows the distribution of the strength of the X-direction component of the magnetic field in the space in the vicinity of each of the end faces 40a and 40b. In FIG. 6, symbols R10 and R20 each indicate a region in which the X-direction component of the magnetic field has a strength of 0 mT; symbols R11 and R22 each indicate a region in which the X-direction component of the magnetic field has a strength of between −4 mT (inclusive) and 0 mT (exclusive); and symbols R12 and R21 each indicate a region in which the X-direction component of the magnetic field has a strength of between 0 mT (exclusive) and 4 mT (inclusive). The arrows in each region indicate the direction of the X-direction component of the magnetic field. Symbol L10 indicates a straight line that passes through the center of the magnet 40 when viewed in the Y direction and extends in the Z direction.

FIG. 7 shows the distribution of the direction of the magnetic field in the space in the vicinity of each of the end faces 40a and 40b. In FIG. 7, symbols R30 and R40 each indicate a region in which the direction of the magnetic field is at 0°; symbols R31 and R42 each indicate a region in which the direction of the magnetic field has an angle of between −10° (inclusive) and 0° (exclusive); and symbols R32 and R41 each indicate a region in which the direction of the magnetic field has an angle of between 0° (exclusive) and 10° (inclusive). The arrows in each region indicate the direction of the magnetic field.

As shown in FIG. 6, in the space lying in the vicinity of the end face 40a and having the same width in the X direction as that of the magnet 40, the region R10 lies to the right of the straight line L10, and the region R11 is wider than the region R12. Further, as shown in FIG. 7, in the space lying in the vicinity of the end face 40a and having the same width in the X direction as that of the magnet 40, the region R30 lies to the right of the straight line L10, and the region R31 is wider than the region R32. These facts indicate that when the MR element 10 is disposed in the vicinity of the end face 40a so that the center of the MR element 10 is located on the straight line L10 when viewed in the Y direction, the direction of the magnetic field applied to the free layer 15 has a negative angle.

Further, as shown in FIG. 6, in the space lying in the vicinity of the end face 40b and having the same width in the X direction as that of the magnet 40, the region R20 lies to the left of the straight line L10, and the region R22 is wider than the region R21. As shown in FIG. 7, in the space lying in the vicinity of the end face 40b and having the same width in the X direction as that of the magnet 40, the region R40 lies to the left of the straight line L10, and the region R42 is wider than the region R41. These facts indicate that when the MR element 10 is disposed in the vicinity of the end face 40b so that the center of the MR element 10 is located on the straight line L10 when viewed in the Y direction, the direction of the magnetic field applied to the free layer 15 has a negative angle.

The phenomenon shown in FIG. 6 and FIG. 7 can be qualitatively explained as follows. As shown in FIG. 6 and FIG. 7, when the direction of the magnetization of the magnet 40 has a positive angle, the center of a magnetic flux passing through the end face 40a lies to the right of the straight line L10 while the center of a magnetic flux passing through the end face 40b lies to the left of the straight line L10. The magnetic flux in the vicinity of the end face 40a expands away from the end face 40a, while the magnetic flux in the vicinity of the end face 40b expands away from the end face 40b. As a result, the strength of the X-direction component of the magnetic field and the direction of the magnetic field in the space in the vicinity of each of the end faces 40a and 40b are distributed as shown in FIG. 6 and FIG. 7.

From the results of the simulation above, it can be seen that the magnetic field component Hb1 of the bias magnetic field Hb is oriented in the opposite direction to the magnetization component M21x of the magnetization M21 of the magnet 21 and the magnetization component M22x of the magnetization M22 of the magnet 22, as shown in FIG. 2.

In this embodiment, it is also possible to control the direction of the bias magnetic field Hb by simply controlling the directions of the magnetizations M21 and M22 of the magnets 21 and 22 while the MR element 10 and the magnets 21 and 22 are disposed so that the centers of the MR element 10 and the magnets 21 and 22 are collinear along the straight line L extending in the Z direction when viewed in the Y direction, as shown in FIG. 2. Thus, in addition to the effects described previously, this embodiment also provides the effect of facilitating the positioning of the MR element 10 and the magnets 21 and 22.

The present invention is not limited to the foregoing embodiment, and various modifications may be made thereto. For example, the bias field generation unit 20 may be constituted of a single magnet. In this case also, it is possible to apply the bias magnetic field Hb including the first magnetic field component Hb1 and the second magnetic field component Hb2 to the free layer 15 through the use of the single magnet.

Further, the scale is not limited to a linear scale but can be a rotating body, such as a multipole-magnetized magnet having a plurality of pairs of N and S poles alternately arranged in a circumferential direction, or a gear having teeth formed of a magnetic material. In such a case, the first direction is the direction of a tangent to the outer circumference of the rotating body in a cross section perpendicular to the central axis of rotation of the rotating body.

Further, the MR element 10 may be formed by stacking the underlayer 11, the free layer 15, the nonmagnetic layer 14, the magnetization pinned layer 13, the antiferromagnetic layer 12, and the protective layer 16 in this order from the bottom.

It is apparent that the present invention can be carried out in various forms and modifications in the light of the foregoing descriptions. Accordingly, within the scope of the following claims and equivalents thereof, the present invention can be carried out in forms other than the foregoing most preferable embodiment.

What is claimed is:

1. A magnetic sensor configured to detect a component of an external magnetic field in a first direction, comprising a magnetoresistive element and a bias field generation unit, wherein the magnetoresistive element includes a magnetization pinned layer having a magnetization pinned in a direction parallel to the first direction, a free layer having a magnetization that varies depending on the component in the first direction of the external magnetic field, and a nonmagnetic layer interposed between the magnetization pinned layer and the free layer, the magnetization pinned layer, the nonmagnetic layer and the free layer are stacked to be adjacent in a second direction orthogonal to the first direction, the free layer receives an interlayer coupling magnetic field in the direction parallel to the first direction resulting from the magnetization pinned layer, the bias field generation unit includes at least one magnet and applies a bias magnetic field to the free layer, the magnetoresistive element and the at least one magnet are aligned in a third direction orthogonal to the first and second directions, the at least one magnet has an end face facing the magnetoresistive element, the at least one magnet has a magnetization in a direction inclined with respect to a direction perpendicular to the end face, the magnetization of the at least one magnet includes a first magnetization component parallel to the first direction and a second magnetization component parallel to the third direction, the bias magnetic field includes a first magnetic field component in a direction opposite to the direction of the interlayer coupling magnetic field and a second magnetic field component parallel to the third direction, the direction of the first magnetic field component is opposite to that of the first magnetization component, and the second magnetic field component is in the same direction as the second magnetization component.

2. The magnetic sensor according to claim 1, wherein the at least one magnet is a pair of magnets arranged with the magnetoresistive element in between.

3. The magnetic sensor according to claim 1, wherein the end face of the at least one magnet is perpendicular to the third direction.

4. A magnetic sensor system comprising:

the magnetic sensor according to claim 1; and a scale whose relative position with respect to the magnetic sensor is variable in the first direction, wherein a change in the relative position of the scale with respect to the magnetic sensor causes a change in the component in the first direction of the external magnetic field.

* * * * *